United States Patent
Lloyd

(10) Patent No.: US 10,003,416 B1
(45) Date of Patent: Jun. 19, 2018

(54) METHOD FOR MEASURING CHARACTERISTICS OF A TRANSMITTER UNIT OF A DEVICE UNDER TEST, TEST SYSTEM AND RADIO FREQUENCY DEVICE

(71) Applicant: Rohde & Schwarz GmbH & Co. KG, Munich (DE)

(72) Inventor: Paul Gareth Lloyd, Munich (DE)

(73) Assignee: Rohde & Schwarz GMBH & Co. KG, Munich (DE)

( * ) Notice: Subject to any disclaimer, the term of this patent is extended or adjusted under 35 U.S.C. 154(b) by 0 days. days.

(21) Appl. No.: 15/381,812

(22) Filed: Dec. 16, 2016

(51) Int. Cl.
*H04B 1/04* (2006.01)
*H04B 17/15* (2015.01)

(52) U.S. Cl.
CPC ........... *H04B 17/15* (2015.01); *H04B 1/0475* (2013.01)

(58) Field of Classification Search
CPC .............................. H04B 17/15; H04B 1/0475
See application file for complete search history.

(56) References Cited

U.S. PATENT DOCUMENTS

| | | | |
|---|---|---|---|
| 2016/0036471 A1* | 2/2016 | Subrahmaniyan Radhakrishnan .... | H04B 1/0475 375/224 |
| 2016/0072530 A1* | 3/2016 | El-Hassan ............ | H03F 1/0227 455/114.2 |
| 2016/0261241 A1* | 9/2016 | Hammi ................. | H03F 1/3258 |
| 2017/0117854 A1* | 4/2017 | Ben Smida ........... | H03F 1/3247 |

FOREIGN PATENT DOCUMENTS

| | | |
|---|---|---|
| GB | 2 516 979 A | 11/2015 |
| WO | 1997/37427 A1 | 10/1997 |
| WO | 2008/134404 A2 | 11/2008 |

OTHER PUBLICATIONS

Hsing-Hung Chen et al: "Joint polynomial and look-up-table power amplifier linearization scheme" IEEE, US, vol. 2, Apr. 22, 2003, pp. 1345-1349 XP010862621.

* cited by examiner

*Primary Examiner* — Dac Ha
(74) *Attorney, Agent, or Firm* — Schwabe, Williamson & Wyatt P.C.

(57) ABSTRACT

A method for measuring characteristics of a transmitter unit of a device under test is described. A signal generator is provided that comprises a baseband processing unit having at least a digital pre-distortion sub-unit. A device under test is provided that has a transmitter unit. A measuring unit is provided. Said signal generator and said device under test are connected with each other via an interface. At least one input signal is generated by using said signal generator, said input signal is forwarded to said device under test. An output signal of said device under test is measured by using said measuring unit. A first pre-distortion parameter for an increasing input amplitude is determined by using said digital pre-distortion sub-unit. A second pre-distortion parameter for a decreasing input amplitude is determined by using said digital pre-distortion sub-unit. Said first and second pre-distortion parameters are determined such that said output signal has a high fidelity. Further, a test system and a radio frequency device are described.

18 Claims, 3 Drawing Sheets

METHOD FOR MEASURING CHARACTERISTICS OF A TRANSMITTER UNIT OF A DEVICE UNDER TEST, TEST SYSTEM AND RADIO FREQUENCY DEVICE

TECHNICAL FIELD

The invention relates to a method for measuring characteristics of a transmitter unit of a device under test, a test system as well as a radio frequency device.

BACKGROUND OF THE INVENTION

In many applications for radio transmitters it is desirable to minimize power consumption whilst achieving sufficient signal fidelity or linearity. For instance, the power consumption is minimized by using an envelope tracking (ET) technique of the power supply whereas the desired signal fidelity or linearity is achieved by using digital pre-distortion (DPD) technique. Hence, digital pre-distortion techniques are typically used in radio frequency applications, in particular in radio transmitters.

By using the digital pre-distortion technique, a signal distortion is determined that is caused by a transmitter unit of the radio frequency device that processes the signal, in particular by a unit of the transmitter unit that has an amplifying function. This signal distortion is derived from measured data of the signal output by the radio transmitter unit. This signal distortion is expected to occur repetitive while using the radio transmitter unit. Accordingly, the signal distortion caused by the transmitter unit is characterized by the specific transmitter unit.

After the signal distortion has been determined, the distortion to be expected is inverted and the inverted distortion is applied to the original signal in a complementary sense prior to the transmitter unit, in particular an amplifier unit of the transmitter unit, such that the original signal is pre-distorted by the inverted distortion. Then, the pre-distorted signal passes through the transmitter unit, in particular its amplifier unit, such that the pre-distortion of the signal is cancelled by the distortion that is caused by the transmitter unit appropriately. Accordingly, the result at the output of the transmitter unit is a signal having a high fidelity with regard to the signal input.

Usually, two different techniques are used for digital pre-distortion which are called memoryless digital pre-distortion and memory mitigation digital pre-distortion. Both methods distinguish from each other by the way of predicting the distortion caused by the transmitter unit. The memoryless digital pre-distortion is incapable of compensating memory effects that affect the efficiency of the digital pre-distortion. In contrast thereto, memory mitigation digital pre-distortion is able to compensate memory effects. However, memory mitigation digital pre-distortion is very complex such that those systems are not suitable for small radio frequency devices such as a mobile device.

As already mentioned above, the enveloped tracking technology is used for minimizing power consumption of the radio frequency device. However, the enveloped tracking technology provides another signal with respect to the radio frequency signal such that two different signals are transmitted. Thus, a high degree of precision is required ensuring that both signals have the same time of arrival (TOA) at the transmitter unit. Misalignments in the time of arrival of both signals cause a degraded linearity and increased memory effects wherein these memory effects result in degraded linearity.

Accordingly, highest fidelity of the signal is achieved by determining the predicted pre-distortion precisely and accurately while the time of arrival difference is minimized.

However, there is a need for a pre-distortion technology being less complex, but effective.

SUMMARY OF THE INVENTION

The invention provides a method for measuring characteristics of a transmitter unit of a device under test. A signal generator is provided which comprises a baseband processing unit having at least a digital pre-distortion sub-unit. A device under test is provided that has a transmitter unit. A measuring unit is also provided. Then, said signal generator and said device under test are connected to each other via an interface. At least one input signal is generated by using said signal generator wherein said input signal is forwarded to said device under test. An output signal of said device under test is measured by using said measuring unit. A first pre-distortion parameter for an increasing input amplitude is determined by using said digital pre-distortion sub-unit. A second pre-distortion parameter for a decreasing input amplitude is determined by using said digital pre-distortion sub-unit. Said first and second pre-distortion parameters are determined such that said output signal has a high fidelity.

In some examples, a method for measuring characteristics of a transmitter unit of a device under test may comprise the following steps:

a) Providing a signal generator comprising a baseband processing unit having at least a digital pre-distortion sub-unit, b) Providing a device under test having a transmitter unit, c) Providing a measuring unit, d) Connecting said signal generator and said device under test with each other via an interface, e) Generating at least one input signal by using said signal generator, said input signal is forwarded to said device under test, f) Measuring an output signal of said device under test by using said measuring unit, g) Determining a first pre-distortion parameter for an increasing input amplitude by using said digital pre-distortion sub-unit, h) Determining a second pre-distortion parameter for a decreasing input amplitude by using said digital pre-distortion sub-unit, i) Said first and second pre-distortion parameters being determined such that said output signal has a high fidelity.

The invention further provides a test system comprising a signal generator, a device under test, and a measuring unit. Said signal generator comprises a baseband processing unit having at least a digital pre-distortion sub-unit. Said device under test comprises a transmitter unit. Said processing unit is connected to said device under test via an interface. Said digital pre-distortion sub-unit is configured to determine a first pre-distortion parameter for an increasing input amplitude and a second pre-distortion parameter for a decreasing input amplitude. Said pre-distortion parameters are determined such that an output signal of said device under test has a high fidelity.

Furthermore, the invention provides a radio frequency device comprising a transmitter unit with an emulation unit. Said emulation unit implements a first pre-distortion parameter for an increasing input amplitude and a second pre-distortion parameter for a decreasing input amplitude.

The invention is based on the finding that the performance of the digital pre-distortion is improved with respect to a memoryless digital pre-distortion by using different pre-distortion parameters for the increasing input amplitude and the decreasing input amplitude of the signal to be processed. However, the complexity of the digital pre-distortion technique according to the invention is reduced with respect to the already known memory mitigation digital pre-distortion technique. In fact, the complexity of the digital pre-distortion technique according to the invention is similar to the memoryless one. Accordingly, the radio frequency device comprising the transmitter unit as well as the emulation unit may be a mobile device such as a mobile phone that ensures high signal fidelity.

The invention is further based on the finding that the transmitter unit itself comprises the emulation unit that implements the pre-distortion parameters such that the signal processed by the radio frequency device, in particular its transmitter unit, is pre-distorted appropriately. Thus, the radio frequency device comprising that transmitter unit has a high linearity. As already mentioned, the performance of the pre-distortion technique according to the invention is improved with respect to the memoryless one.

According to an aspect, said first and second pre-distortion parameters are stored in an emulation unit wherein said emulation unit is part of said transmitter unit such that said transmitter unit is set. Accordingly, the pre-distortion parameters that were previously determined are used to set the radio frequency device, in particular the transmitter unit being part of the radio frequency device. This ensures that the signals processed by the radio frequency device have a high fidelity. Hence, the radio frequency device has good properties with respect to the linearity.

According to another aspect, said measuring unit is at least connected to said signal generator. Thus, the signal generated by the signal generator comprising the baseband processing unit with the digital pre-distortion sub-unit is influenced by the measuring results obtained by the measuring unit.

According to a certain embodiment, said baseband processing unit compares said output signal with an expected signal for determining said first and second pre-distortion parameters. The baseband processing unit, in particular its pre-distortion sub-unit, adapts the pre-distortion parameters such that the signal measured by the measuring unit corresponds to an expected signal, for instance the original one with regard to the signal fidelity. If the pre-distortion parameters are well defined, a high fidelity of the signal processed by the transmitter unit will be ensured.

Particularly, said baseband processing unit divides a composition of said output signal into two parts wherein a first part relates to an increasing input amplitude for said first pre-distortion parameter and a second part relates to a decreasing input amplitude for said second pre-distortion parameter. Thus, the signal output and forwarded to the baseband processing unit is processed such that a population of measured signal points is created which is divided into two parts for an increasing input amplitude and a decreasing input amplitude. Accordingly, the baseband processing unit may determine the pre-distortion parameters appropriately and in an efficient manner.

Furthermore, said baseband processing unit may create a model of said transmitter unit using said two parts. Thus, the model for defining the characteristics of the transmitter unit is based on the composition divided into two parts wherein the parts relate to the increasing and the decreasing input amplitudes.

According to an embodiment, said parts are weighted differently. The model can be adapted to certain applications intended for the transmitter unit. For instance, the model can give more weight to the part related to the increasing input amplitude due to the fact that the transmitter unit will be used in a certain radio frequency device wherein it is of importance that the corresponding signal parts are processed accurately.

According to an aspect, said first pre-distortion parameter and said second pre-distortion parameter are determined separately for at least a first signal level such that both pre-distortion parameters do not influence each other. Both pre-distortion parameters are determined by the baseband processing unit completely separately. Thus, the pre-distortion parameters do not influence each other while they are determined. In other words, the first pre-distortion parameter has no influence on the second one during its determination and vice versa. Thus, the underlying pre-distortion functions of the model used are exclusively for the increasing and the decreasing input amplitudes, respectively. A smooth transition area between both parts relating to the increasing and decreasing input amplitudes may be not intended for the first signal level.

However, said first pre-distortion parameter and said second pre-distortion parameter may be determined dependently for at least a second signal level such that both pre-distortion parameters correlate with each other. The population of measured signal points may be shared or pooled for high signal levels such that a smooth transition area between both parts is ensured, for instance.

According to another aspect, said first pre-distortion parameter and said second pre-distortion parameter are derived from at least one look-up table and/or at least one memoryless linearization polynomial. Accordingly, the pre-distortion parameters can be determined easily. Thus, the complexity of the digital pre-distortion technique is reduced with respect to a memory mitigation digital pre-distortion technique as only two linearization polynomials may be used instead of a complex equation system, for instance. Alternatively, two look-up tables can be used wherein a first look-up table is used for the first pre-distortion parameter and a second look-up table is used for the second pre-distortion parameter. Moreover, a hybrid version may be used wherein the first pre-distortion parameter is determined by a linearization polynomial and the second one by a look-up table or vice versa.

Said measuring unit may be integrated in said signal generator, in particular wherein said measuring unit is assigned to a feedback line of said signal generator. Thus, the baseband processing unit itself may comprise the measuring unit. The baseband processing unit just receives the output signal of the transmitter unit, for instance via the feedback line. The output signal is measured, analyzed and processed by the baseband processing unit accordingly such that the pre-distortion parameters are adapted appropriately with regard to the distortion that is caused by the transmitter unit.

According to an aspect, said measuring unit is a measuring device being formed separately with respect to said signal generator, in particular a radio frequency receiver or a multimeter. Thus, the measuring device can be connected with the output of the device under test for measuring the signal output. The separately formed measuring device can also be connected with the signal generator such that the measured signal and/or parameters related to the signal output are forwarded to the signal generator, in particular the baseband processing unit, which in turn adapts the pre-distortion parameters and the corresponding pre-distortion of the signal appropriately.

Particularly, said signal generator comprises a first signal generator unit and a second signal generator unit. Thus, the signal generator may generate at least two different signals, for instance a radio frequency signal as well as an envelope tracking signal that is used to lower the power consumption of the transmitter unit.

According to a certain embodiment, said first signal generator unit is configured to generate a radio frequency input signal and/or said second signal generator unit is configured to generate an envelope tracking signal. Hence, an unambiguous assignment may be given.

Accordingly, said interface may comprise a radio frequency forward interface and a backward interface. The radio frequency forward interface is connected with said first signal generator unit whereas the backward interface is connected with the second signal generator unit, for instance. Accordingly, the device under test is connected with a signal generator via at least two connections forming the common interface.

Moreover, said transmitter unit may comprise an amplifier unit. Thus the transmitter unit is used to amplify the signal forwarded to the transmitter unit appropriately. Usually, amplifying a signal has the biggest impact on the signal distortion of a signal processed by a radio frequency device.

Particularly, said test system is configured to perform the method described above. The advantages and effects mentioned above also apply to the test system in a similar manner.

Furthermore, said transmitter unit of the radio frequency device is set by the method described above. Thus, a radio frequency device having a high linearity and outputting a signal with high fidelity is provided wherein these characteristics are ensured by using a less complex digital pre-distortion technique with regard to a memory mitigation pre-distortion technique while obtaining substantially the same performance as the memory mitigation pre-distortion technique.

In general, the first and second pre-distortion parameters can be used for the radio frequency signal and/or the envelope tracking signal. Alternatively, different pre-distortion parameters are used for the radio frequency signal and the envelope tracking signal.

Furthermore, only pre-distortion parameters for the radio frequency signal or the envelope tracking signal are determined.

In general, the pre-distortion parameters for the radio frequency signal and the ones for the envelope tracking signal may be determined simultaneously.

BRIEF DESCRIPTION OF DRAWINGS

The invention will now be described with reference to an exemplary embodiment which is shown in the enclosed drawings. In the drawings, FIG. 1 schematically shows a test system according to the invention which is used for measuring characteristics of a transmitter unit of a device under test.

DETAILED DESCRIPTION

Figure 1:
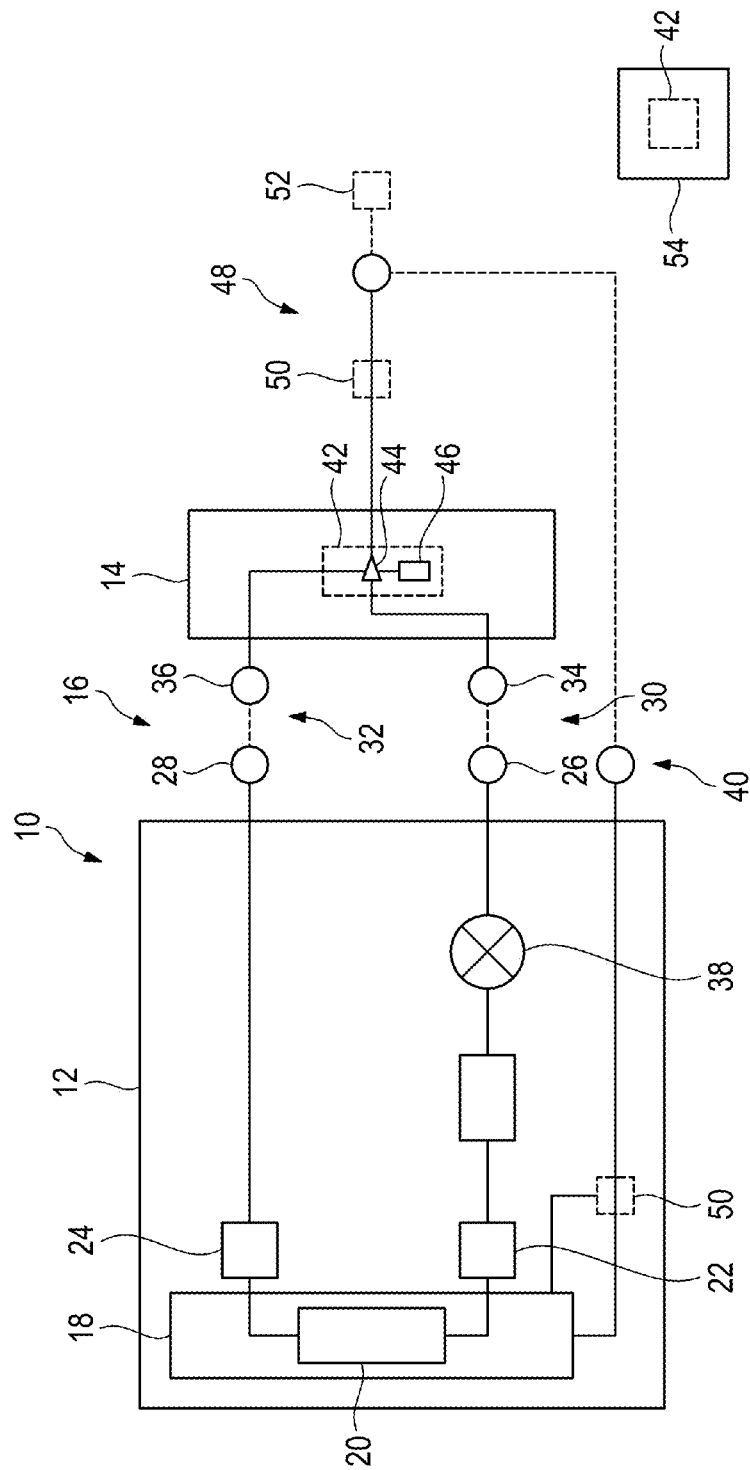

In FIG. 1, a test system 10 is schematically shown which comprises a signal generator 12 and a device under test 14 wherein the signal generator 12 and the device under test 14 are connected with each other via an interface 16.

The signal generator 12 comprises a baseband processing unit 18 having at least a digital pre-distortion sub-unit 20 that is connected to a first signal generator unit 22 and a second signal generator unit 24. Both signal generator units 22, 24 are each assigned to a corresponding output 26, 28 wherein the first output 26 is part of a radio frequency forward interface 30 whereas the second output 28 is part of the backward interface 32.

The radio frequency forward interface 30 and the backward interface 32 define the interface 16. Accordingly, the device under test 14 has two inputs 34, 36 which are connected with the outputs 26, 28 via the radio frequency forward interface 30 and the backward interface 32, respectively.

Particularly, the radio frequency forward interface 30 may comprise more than one connection line such that further signal paths are provided.

Further, the signal generator 12 comprises at least an up-converter 38 being assigned to the radio frequency forward interface 30 for providing the radio frequency signal. Alternatively, the up-converter 38 can also be part of the first signal generator unit 22.

In the shown embodiment, the signal generator 12 also comprises a feedback path interface 40 that is connected with the baseband processing unit 18, in particular its digital pre-distortion sub-unit 20. The signal generator 12 is also connected with the device under test 14 via the feedback path interface 40 as will be described later.

The device under test 14 comprises a transmitter unit 42 that has an amplifying function, in particular an amplifier unit 44, as well as an emulation unit 46 that is connected to the unit having the amplifying function, in particular the amplifier unit 44.

Furthermore, the device under test 14 has an output interface 48 which is used to output the signal processed by the device under test 14 that has been forwarded to the device under test 14 via the interfaces 30, 32 previously.

In the shown embodiment, the device under test 14 is connected with the signal generator 12 via the output interface 48 and the feedback path interface 40 such that the signal output by the device under test 14 is returned to the signal generator 12 for analyzing purposes.

Accordingly, a measuring unit 50 is provided that is integrated in the signal generator 12 according to the shown embodiment wherein the measuring unit 50 is assigned to a feedback line of the signal generator 12 that connects the feedback path interface 40 and the baseband processing unit 18.

Alternatively or additionally, the measuring unit 50 may be assigned to the output interface 48 of the device under test 14 directly. Thus, the measuring unit 50 can be formed separately with respect to the signal generator 12, for instance as a multimeter or a radio frequency receiver that is simply connected to the output of the device under test 14. Thus, the measuring unit 50 can be deemed as a measuring device 52 as optionally shown in FIG. 1.

In addition, the separately formed measuring unit 50 can also be connected to the signal generator 12 in order to provide information and/or parameters measured while measuring the signal output by the device under test 14.

Figure 2:
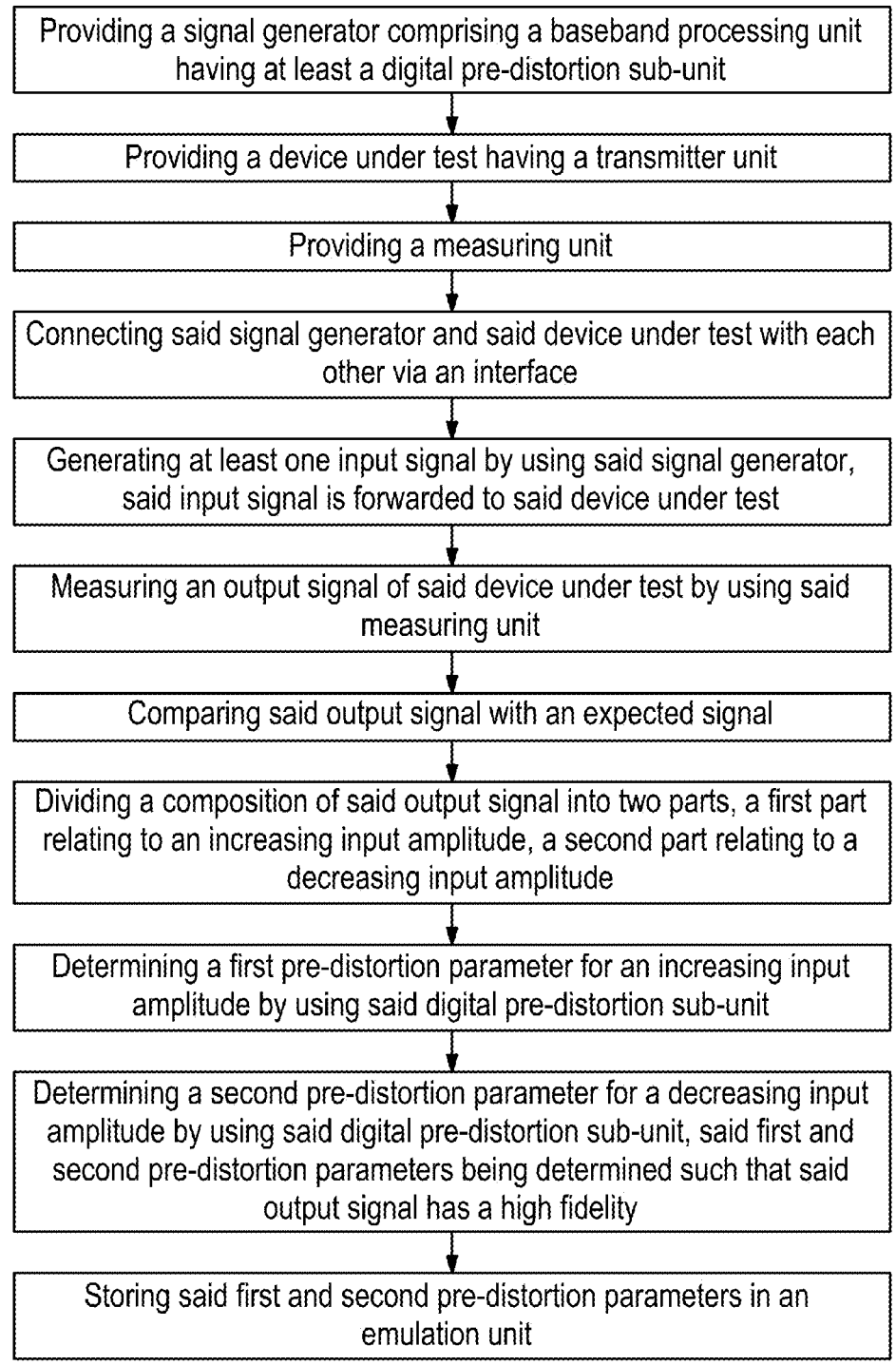
FIG. 2 shows a flow-chart of a method for measuring characteristics of a transmitter unit of a device under test according to the invention and setting a radio frequency device according to the invention.

The test system 10 shown in FIG. 1 can be used to perform a method that is illustrated by the flow-chart shown in FIG. 2.

The signal generator 12 may generate at least one input signal that is forwarded to the device under test 14. Particularly, the signal generator 12 generates an envelope tracking signal that is forwarded to the device under test 14 via the backward interface 32 and a radio frequency input signal that is forwarded to the device under test 14 via the radio frequency forward interface 30.

The signals forwarded to the device under test 14 are processed by the device under test 14, in particular its transmitter unit 42, such that a single output signal is generated that is output via the output interface 48, in particular in an amplified manner with respect to the radio frequency input signal.

As the transmitter unit 42 distorts the signal processed while amplifying the signal input, the signal output is measured and forwarded to the signal generator 12, in particular the digital pre-distortion sub-unit 20 of the baseband processing unit 18. The baseband processing unit 18 compares the signal received that corresponds to the signal output with an expected signal to be output by the device under test 14 depending on the signal(s) generated, in particular generated by both signal generator units 22, 24.

Particularly, the signal received corresponds to the signal measured by the measuring unit 50, for instance the integrated measuring unit 50 or the measuring device 52.

Figure 3:
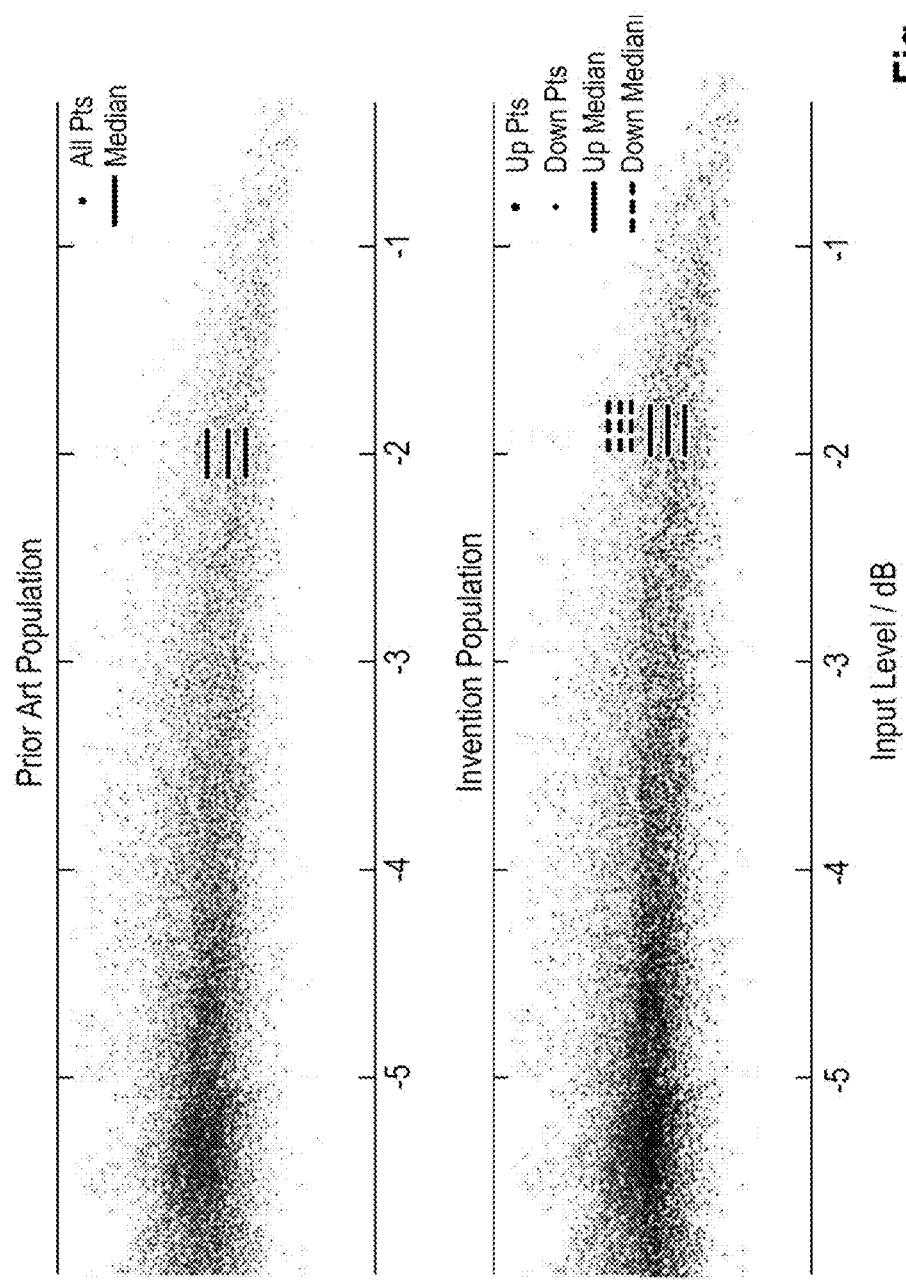
FIG. 3 shows a diagram illustrating the signal population of a signal output using a digital pre-distortion technique known in the prior art and by using the digital pre-distortion technique according to the invention.

While comparing the signal output with the expected one, the baseband processing unit 18 divides a composition or population of said output signal into at least two parts wherein a first part relates to an increasing input amplitude and a second part relates to a decreasing input amplitude of the signal output (please refer to FIG. 3).

Both parts are then used to create a model while using the baseband processing unit 18 such that a first pre-distortion parameter for the increasing input amplitude as well as a second pre-distortion parameter for the decreasing input amplitude are determined wherein the pre-distortion parameters relate to inverted measuring results of the output signal obtained via the output interface 48 and the feedback interface 40. Both parts are processed by the baseband processing unit 18 of the signal generator 12 in order to create the model that defines the transmitter unit 42 with regard to its disturbing properties.

Particularly, the pre-distortion parameters can be derived from at least one look-up table and/or at least one memoryless linearization polynomial. Accordingly, a first memoryless linearization polynomial and a second memoryless linearization polynomial may be used for the first pre-distortion parameter and the second pre-distortion parameter, respectively. In a similar manner, a first look-up table and a second look-up table may be used for the pre-distortion parameters, respectively. Furthermore, a hybrid version may be used wherein the first pre-distortion parameter is determined by a linearization polynomial and the second one by a look-up table or vice versa.

Thus, the signal generated by the signal generator 12 is digitally pre-distorted in such a manner that the increasing input amplitude is pre-distorted according to the first pre-distortion parameter whereas the decreasing input amplitude is pre-distorted by the second pre-distortion parameter wherein both pre-distortion parameters are determined by the digital pre-distortion sub-unit 20 such that the signal output has a high fidelity ensuring a high linearity of the device under test 14, in particular its transmitter unit 42.

This is also shown in FIG. 3 as different median values are illustrated that correspond to the increasing and decreasing input amplitudes, respectively.

The steps mentioned above can be performed iteratively such that the best pre-distortion parameters are obtained ensuring the highest signal fidelity.

After both pre-distortion parameters have been determined by using the test system 10 shown in FIG. 1, these pre-distortion parameters can be stored in the emulation unit 46 of the transmitter unit 42. Accordingly, the transmitter unit 42 is set by these pre-distortion parameters ensuring that the signal distortion caused by the unit having the amplifying function is cancelled due to the pre-distortion parameters that are used while the emulation unit 46 emulates a corresponding baseband modem. Thus, the signal processed by the transmitter unit 42 has a high fidelity such that the transmitter unit 42 itself has a high linearity.

Then, the transmitter unit 42 being part of the device under test 14 can be dismounted from the device under test 14 and incorporated in a separately formed radio frequency device 54, for instance a mobile device such as a mobile phone.

As the emulation unit 46 comprises both pre-distortion parameters for the increasing input amplitude as well as the decreasing input amplitude, it is ensured that the signal processed by the transmitter unit 42 that is implemented in the radio frequency device 54 has a high fidelity.

Furthermore, both parts of the composition of the output signal can be weighted differently depending on the application intended for the transmitter unit 42. Thus, the resulting pre-distortion parameters are different, in particular better adapted for the intended use of the transmitter unit 42.

Moreover, the pre-distortion parameters can be determined separately from each other for a first signal level which means that they do not depend from each other.

Alternatively or additionally, the pre-distortion parameters can be determined dependently such that they influence each other. Thus, pre-distortion parameters are provided that correlate with each other. However, as only two different pre-distortion parameters are used for the increasing and decreasing input amplitudes, the complexity of the pre-distortion technique is still reduced with respect to a memory mitigation digital pre-distortion technique.

As already mentioned, the test system 10 is used to determine pre-distortion parameters for the transmitter unit 42 that is implemented in the device under test 14 during measuring its characteristics. When the pre-distortion parameters have been determined, they can be implemented in the emulation unit 46 of the transmitter unit 42 which will be implemented in the radio frequency device 54 afterwards. Thus, the radio frequency device 54 has a high linearity.

Accordingly, the complexity of the digital pre-distortion technique is minimized with respect to a memory mitigation digital pre-distortion technique while obtaining substantially the same performance. Hence, the costs are also reduced. Furthermore, radio frequency devices 54, in particular mobile devices, can be provided that have a high linearity.

The invention claimed is:

1. A method for measuring characteristics of a transmitter unit of a device under test, comprising:
providing a signal generator comprising a baseband processing unit having at least a digital pre-distortion sub-unit;
providing a device under test having a transmitter unit;
providing a measuring unit;
connecting said signal generator and said device under test with each other via an interface;
generating at least one input signal by using said signal generator, said input signal is forwarded to said device under test;
measuring an output signal of said device under test by using said measuring unit;

determining a first pre-distortion parameter for an increasing input amplitude by using said digital pre-distortion sub-unit; and determining a second pre-distortion parameter different from the first pre-distortion parameter for a decreasing input amplitude by using said digital pre-distortion sub-unit, said first and second pre-distortion parameters being determined such that said output signal has a high fidelity, wherein said baseband processing unit divides a composition of said output signal into two parts, a first part relating to the increasing input amplitude for said first pre-distortion parameter, and a second part relating to the decreasing input amplitude for said second pre-distortion parameter.

2. The method according to claim 1, wherein said first and second pre-distortion parameters are stored in an emulation unit, said emulation unit being part of said transmitter unit to set said transmitter unit.

3. The method according to claim 1, wherein said measuring unit is at least connected to said signal generator.

4. The method according to claim 1, wherein said baseband processing unit compares said output signal with an expected signal for determining said first and second pre-distortion parameters.

5. The method according to claim 1, wherein said baseband processing unit creates a model of said transmitter unit using said two parts.

6. The method according to claim 1, wherein said parts are weighted differently.

7. The method according to claim 1, wherein said first pre-distortion parameter and said second pre-distortion parameter are determined separately for at least a first signal level such that both pre-distortion parameters do not influence each other.

8. The method according to claim 1, wherein said first pre-distortion parameter and said second pre-distortion parameter are determined dependently for at least a second signal level such that both pre-distortion parameters correlate with each other.

9. The method according to claim 1, wherein said first pre-distortion parameter and said second pre-distortion parameter are derived from at least one look-up table and/or at least one memoryless linearization polynomial.

10. A test system comprising:
a device under test including a transmitter unit;
a measuring unit; and
a signal generator including a baseband processing unit having a digital pre-distortion sub-unit, said processing unit being connected to said device under test via an interface, said digital pre-distortion sub-unit being configured to determine a first pre-distortion parameter for an increasing input amplitude and a second pre-distortion parameter different from the first pre-distortion parameter for a decreasing input amplitude, said pre-distortion parameters being determined to increase a fidelity of an output signal of said device under test, wherein said baseband processing unit divides a composition of said output signal into two parts, a first part relating to the increasing input amplitude for said first pre-distortion parameter, and a second part relating to the decreasing input amplitude for said second pre-distortion parameter.

11. The test system according to claim 10, wherein said measuring unit is integrated in said signal generator, in particular wherein said measuring unit is assigned to a feedback line of said signal generator.

12. The test system according to claim 10, wherein said measuring unit is a measuring device being formed separately with respect to said signal generator, in particular a radio frequency receiver or a multimeter.

13. The test system according to claim 10, wherein said signal generator comprises a first signal generator unit and a second signal generator unit.

14. The test system according to claim 13, wherein said first signal generator unit is configured to generate a radio frequency input signal and/or said second signal generator unit is configured to generate an envelope tracking signal.

15. The test system according to claim 10, wherein said interface comprises a radio frequency forward interface and a backward interface.

16. The test system according to claim 10, wherein said transmitter unit comprises an amplifier unit.

17. The test system according to claim 10, wherein said test system is configured to:
generate at least one input signal by using said signal generator and forward said input signal to said device under test;
measure an output signal of said device under test by using said measuring unit;
determine said first pre-distortion parameter for said increasing input amplitude by using said digital pre-distortion sub-unit; and
determine said second pre-distortion parameter different from said first pre-distortion parameter for said decreasing input amplitude by using said digital pre-distortion sub-unit.

18. A radio frequency device comprising a transmitter unit with an emulation unit, said emulation unit implementing a first pre-distortion parameter for an increasing input amplitude and a second pre-distortion parameter different from the first pre-distortion parameter for a decreasing input amplitude, wherein said transmitter unit is set by a method comprising:
providing a signal generator comprising a baseband processing unit having at least a digital pre-distortion sub-unit;
providing a device under test having a transmitter unit;
providing a measuring unit;
connecting said signal generator and said device under test with each other via an interface;
generating at least one input signal by using said signal generator, said input signal is forwarded to said device under test;
measuring an output signal of said device under test by using said measuring unit;
determining the first pre-distortion parameter for the increasing input amplitude by using said digital pre-distortion sub-unit;
determining the second pre-distortion parameter for the decreasing input amplitude by using said digital pre-distortion sub-unit, wherein said baseband processing unit divides a composition of said output signal into two parts, a first part relating to the increasing input amplitude for said first pre-distortion parameter, and a second part relating to the decreasing input amplitude for said second pre-distortion parameter; and
storing the first and second pre-distortion parameters in the emulation unit.

\* \* \* \* \*